United States Patent
Nie et al.

(10) Patent No.: US 11,386,962 B2
(45) Date of Patent: Jul. 12, 2022

(54) METHOD FOR PROGRAMMING 3D NAND FLASH MEMORY

(71) Applicant: CHINA FLASH CO., LTD., Shanghai (CN)

(72) Inventors: Hong Nie, Shanghai (CN); Jingwei Chen, Shanghai (CN)

(73) Assignee: CHINA FLASH CO., LTD., Shanghai (CN)

( * ) Notice: Subject to any disclaimer, the term of this patent is extended or adjusted under 35 U.S.C. 154(b) by 0 days.

(21) Appl. No.: 17/486,908

(22) Filed: Sep. 27, 2021

(65) Prior Publication Data

US 2022/0101925 A1 Mar. 31, 2022

(30) Foreign Application Priority Data

Sep. 29, 2020 (CN) .......................... 202011050195.2

(51) Int. Cl.

| | |
|---|---|
| *G11C 11/34* | (2006.01) |
| *G11C 16/10* | (2006.01) |
| *G11C 16/24* | (2006.01) |
| *G11C 16/26* | (2006.01) |
| *G11C 16/12* | (2006.01) |

(52) U.S. Cl.
CPC ............ *G11C 16/102* (2013.01); *G11C 16/12* (2013.01); *G11C 16/24* (2013.01); *G11C 16/26* (2013.01)

(58) Field of Classification Search
CPC ......... G11C 16/10; G11C 16/30; G11C 16/12; G11C 16/0483
USPC ............................................... 365/185.18, 63
See application file for complete search history.

(56) References Cited

U.S. PATENT DOCUMENTS

| | | | | |
|---|---|---|---|---|
| 2002/0191474 A1* | 12/2002 | Chevallier | ............. | G11C 16/08 365/185.11 |
| 2015/0003151 A1* | 1/2015 | Lee | ..................... | G11C 11/5628 365/185.02 |

FOREIGN PATENT DOCUMENTS

| | | |
|---|---|---|
| CN | 101986389 A | 3/2011 |
| CN | 103700399 A | 4/2014 |
| CN | 104240759 A | 12/2014 |
| CN | 111133580 A | 5/2020 |
| CN | 111312717 A | 6/2020 |

* cited by examiner

*Primary Examiner* — Son T Dinh
(74) *Attorney, Agent, or Firm* — Global IP Services; Tianhua Gu

(57) ABSTRACT

The present disclosure relates to a method for programming a 3D NAND flash memory, which includes: S1) providing a 3D flash memory array, and eliminating residual charges; S2) strobing a bit line where an upper sub-storage module is located; S3) applying a drain voltage to the drain of a to-be-programmed memory cell, and floating a source thereof; S4) applying a programming voltage to the gate of the to-be-programmed memory cell, to complete programming; and S5) after completing the programming of the upper sub-storage module, and when the upper sub-storage module keeps a programmed state, strobing a bit line where a lower sub-storage module is located, and repeating operation S3) and operation S4) to achieve programming of the lower sub-storage module. In the method for programming a 3D NAND flash memory according to the present disclosure, programming is completed based on tertiary electron collision.

12 Claims, 7 Drawing Sheets

METHOD FOR PROGRAMMING 3D NAND FLASH MEMORY

CROSS REFERENCE TO RELATED APPLICATION

The present application claims the benefit of priority to Chinese Patent Application No. CN 2020110501952, entitled "METHOD FOR PROGRAMMING 3D NAND FLASH MEMORY", filed with CNIPA on Sep. 29, 2020, the disclosure of which is incorporated herein by reference in its entirety for all purposes.

TECHNICAL FIELD

The present disclosure relates to integrated circuits, in particular, to a method for programming a 3D NAND flash memory.

BACKGROUND

With the development of planer flash memory, the manufacturing technique of semiconductors has made huge progress. However, in recent years, the development of the planer flash memory encountered various challenges, such as physical limits, the limits of existing techniques, the limits of stored electron density, and the like. In light of this, to overcome the above challenges and to pursue lower production costs of memory cells, various different three-dimensional (3D) flash memory structures came into being, such as 3D NOR flash memory, and 3D NAND flash memory.

In 3D NAND flash memory, memory cells are arranged in series between bit lines and ground wires. NAND flash memory with a serial structure has a relatively low read speed, but has a relatively high write speed and erasure speed. 3D NAND flash memory may be more suitable for data storage usages, as 3D NAND flash memory has the advantages of small size and large capacity. Specifically, compared with planer 2D NAND flash memory, 3D NAND flash memory has a larger storage capacity and lower costs per memory unit when the two have the same area, and thus 3D NAND flash memory has a more promising future considering that low power consumption and large capacity are the current trend of the electronic product market.

As shown in FIG. 1, in a conventional circuit voltage operation, a high voltage Vpgm (for example, 18 V) is applied to a word line of a to-be-programmed memory cell (addressed cell), meanwhile, the high voltage Vpgm is also applied to other cells in the same word line. However, to prevent the other cells in the word line from being programmed, a voltage Vpi (for example, 8 V) needs to be applied to corresponding bit lines. Such an approach could reduce the potential current difference on the device's tunnel oxide layer, thereby preventing the unselected cells from being programmed. This approach may also be referred to as self-boosted program inhibit (SBPI), in which the voltage Vpi is applied to bit lines of NAND strings which may inhibit the memory cell from being programmed.

The conventional SBPI method has the following shortcomings:

1) A charge pump needs to supply high voltage to the bit lines and word lines, but the bit lines have high capacitance and therefore may cause relatively high power consumption; and the charge pump also occupies a relatively large chip area.

2) When a to-be-programmed bit line is set to 0 V, there is a large voltage difference between the bit line and an adjacent bit line that is prevented from being programmed, which may be set to 8 V. If the distance between the two adjacent bit lines may be excessively small, an electron breakdown may occur, which also hinders miniaturization of memory arrays.

Therefore, to reduce the operating voltage thereby further reducing the power consumption of flash memory and the interference between adjacent memory cells is an urgent challenge facing those skilled in the art.

SUMMARY

In view of the shortcomings in the prior art, the present disclosure provides a method for programming a 3D NAND flash memory, to solve problems of flash memory in the prior art such as high programming voltage, high power consumption, and interference between adjacent memory cells.

Specifically, the present disclosure provides a method for programming a 3D NAND flash memory. The method for programming a 3D NAND flash memory at least comprises:

S1) providing a 3D NAND flash memory array, and eliminating residual charges in the 3D NAND flash memory array;

S2) strobing a bit line where an upper sub-storage module is located, to program a to-be-programmed memory cell in the upper sub-storage module;

S3) applying a drain voltage to the drain of the to-be-programmed memory cell, and floating the source of the to-be-programmed memory cell, to generate primary electrons in the to-be-programmed memory cell, wherein the primary electrons accelerate to collide with a substrate to generate secondary electrons;

S4) applying a programming voltage to the gate of the to-be-programmed memory cell, to enable the secondary electrons to generate tertiary electrons under the action of a vertical electric field and inject the tertiary electrons into the floating gate of the to-be-programmed memory cell, to complete programming; and S5) after completing the programming of the upper sub-storage module, when the upper sub-storage module remains in a programmed state, strobing the bit line where a lower sub-storage module is located, and repeating operation S3) and operation S4) to achieve programming of the lower sub-storage module.

Optionally, the 3D NAND flash memory array comprises a plurality of storage modules, each storage module comprises an upper sub-storage module and a lower sub-storage module, and both the upper sub-storage module and lower sub-storage module comprise n rows and b columns of memory cells; gates of memory cells in the same row are connected to the same word line; memory cells in the same column are connected to each other sequentially in series, one end of each column is connected to a corresponding local bit line through a bit line strobe, the other end is connected to a source line, and bit line strobes in the same row are connected to the same bit line strobe signal; local bit lines in the same column of the upper sub-storage module and the lower sub-storage module are connected to the same global bit line; and n and b are natural numbers greater than 0.

Further optionally, at operation S1), the method further includes strobing bit line strobes of the upper sub-storage module and bit line strobes of the lower sub-storage module, to ground word lines and source lines of the upper sub-storage module and the lower sub-storage module of each storage module, to eliminate residual charges in the 3D NAND flash memory array.

Further optionally, the applying the drain voltage at operation S3) comprises: applying the drain voltage to a global bit line where the to-be-programmed memory cell is located, and strobing bit line strobes of the upper sub-storage module and memory cells between the to-be-programmed memory cell and the bit line strobes of the upper sub-storage module, in order to transmit the drain voltage to the drain of the to-be-programmed memory cell and float the source line corresponding to the to-be-programmed memory cell.

Further optionally, operation S3) further comprises turning off bit line strobes of the lower sub-storage module, and grounding source lines of the lower sub-storage module.

Further optionally, maintaining the programmed state of the upper sub-storage module at operation S5) comprises: turning off bit line strobes of the upper sub-storage module and the memory cells, and grounding the source lines.

Optionally, the programming is completed after the programming voltage at operation S4) has been maintained for a preset time.

Further optionally, the preset time is less than 100 μs.

Optionally, the difference between the voltage applied to the drain and the voltage applied to the substrate of the to-be-programmed memory cell is between 4 V and 8 V.

Optionally, the programming voltage is not higher than 10 V.

Further optionally, operation S3) may be replaced with: first floating the source of the to-be-programmed memory cell, and then applying a drain voltage to the drain of the to-be-programmed memory cell.

Further optionally, the programming sequence of the upper sub-storage module and the lower sub-storage module may be reversed.

As described above, the method for programming a 3D NAND flash memory according to the present disclosure has the following beneficial effects:

In the method for programming a 3D NAND flash memory according to the present disclosure, the upper sub-storage module and the lower sub-storage module are separated for programming, the sub-storage module that needs to be programmed is selected through a bit line strobe, a drain voltage is applied after residual charges are eliminated and a source is floating, and a programming voltage is then applied, to complete programming based on tertiary electron collision. The gate voltage during programming is far less than the gate voltage of existing Fowler-Nordheim (F-N) tunneling programming methods, and the programming time is shorter, which can effectively reduce power consumption and avoid interference between adjacent memory cells, thereby improving programming efficiency.

REFERENCE NUMERALS

Figure 1:
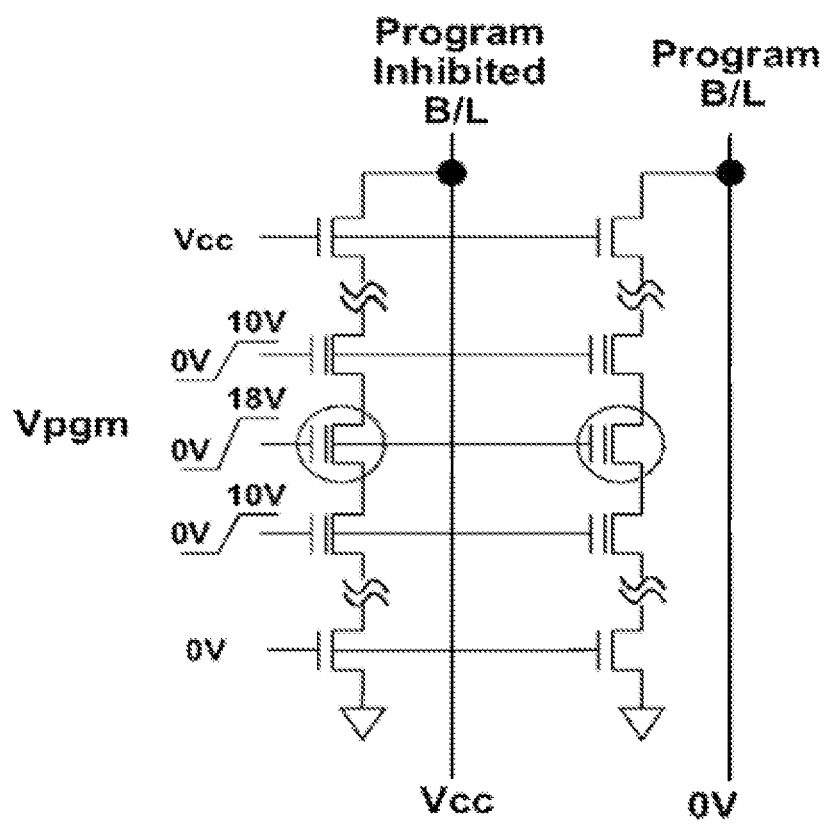
FIG. 1 is a schematic diagram illustrating the principle of a prior-art method for programming a 3D NAND flash memory.

1 Storage module
11 Upper sub-storage module
111 To-be-programmed memory cell
12 Lower sub-storage module
S1 to S5 Various Operations

DETAILED DESCRIPTION

The following describes implementations of the present disclosure by specific embodiments. A person skilled in the art may easily understand other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

Reference is made to FIG. 2 to FIG. 7. It should be noted that the drawings provided in this embodiment only exemplify the basic idea of the present disclosure. Therefore, only the components related to the present disclosure are shown in the drawings, and are not drawn according to the quantities, shapes, and sizes of the components during actual implementation. During actual implementation, the types, quantities, and proportions of the components may be changed without limitation, and the layout of the components may be more complex.

In order to program a specific string in a 3D NAND flash memory, it is necessary to control an upper strobe and a lower strobe of the 3D NAND flash memory. The architecture of the 3D NAND flash memory defines a plurality of upper-layer devices as the upper strobes, so that either the gate threshold voltages of the upper strobes may be modified to a suitable range individually, or gate threshold voltages of the upper strobes may be modified to a suitable range together as a whole. The term "strobe" may be referred to as "select gate", and the verb term "strobe" may be referred to as "select".

For a selected string of the 3D NAND flash memory, a voltage is applied to the gate of an upper strobe of this selected string in order to turn on an upper selected gate. In this way, when the upper strobe of the selected string is fully turned on, the programming efficiency of the selected string is improved. In addition, 0 V is applied to the gate of an upper strobe of an unselected string in order to turn off the upper strobe of this unselected string. And when the upper strobe of the unselected string is fully turned off, programming interference caused by current leakage of the unselected string may be avoided.

Figure 2:
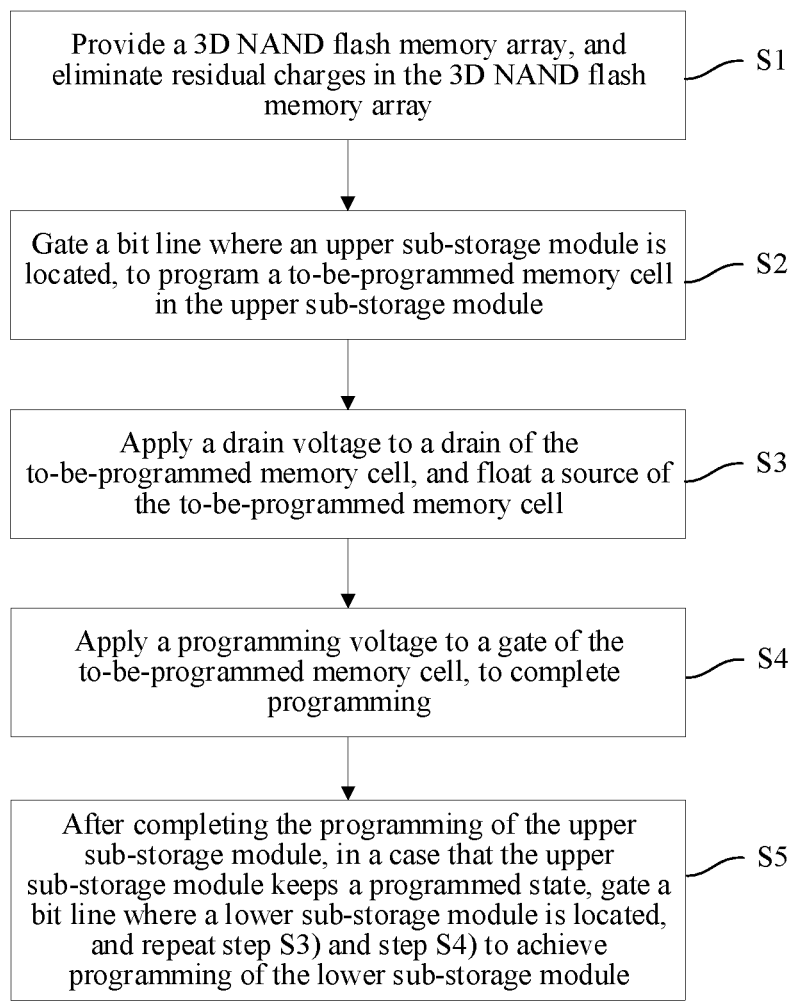
FIG. 2 is a schematic flowchart illustrating a method for programming a 3D NAND flash memory.

As shown in FIG. 2, the present disclosure provides a method for programming a 3D NAND flash memory, and the method for programming a 3D NAND flash memory comprises the following operations S1, S2, S3, S4 and S5:

Operation S1) Provide a 3D NAND flash memory array, and eliminate residual charges in the 3D NAND flash memory array.

Figure 3:
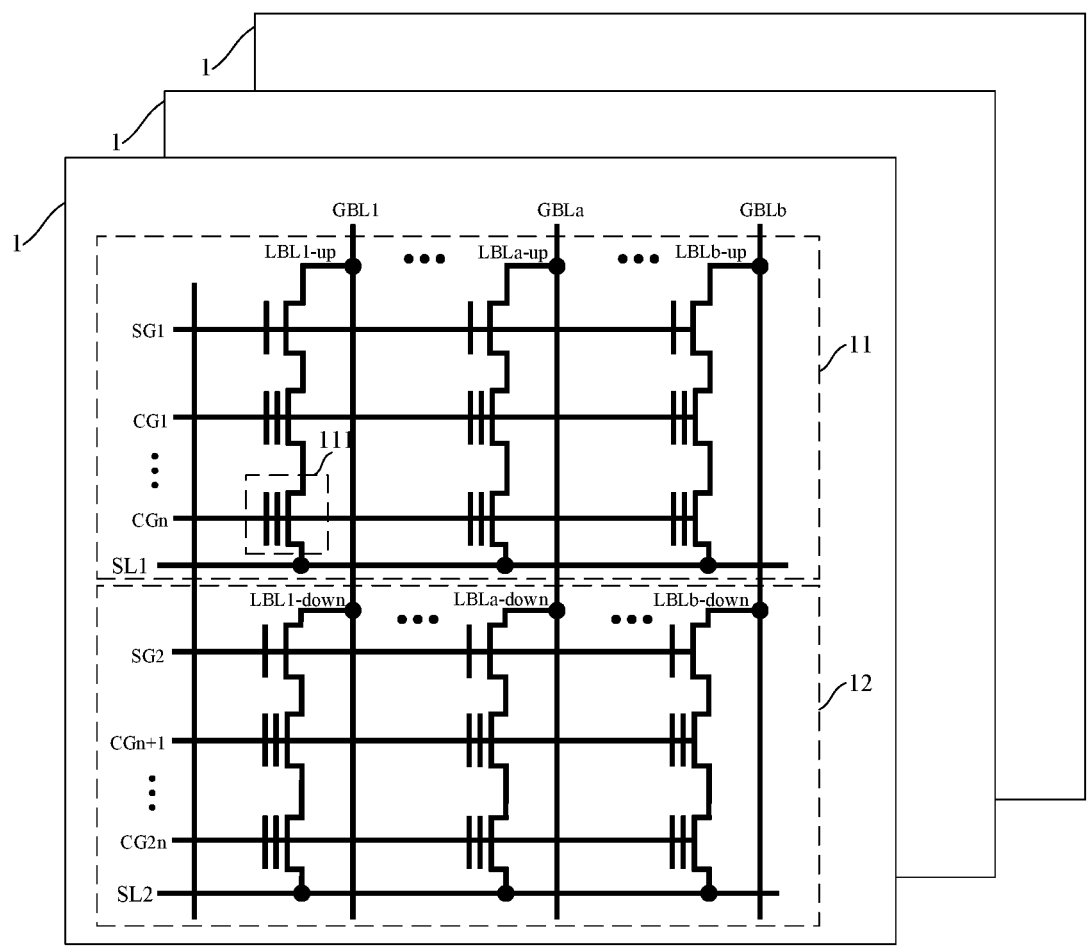
FIG. 3 is a schematic structural diagram of a 3D NAND flash memory array.

Specifically, as shown in FIG. 3, the 3D NAND flash memory array includes a plurality of storage modules 1, each of the storage modules 1 comprises an upper sub-storage module 11 and a lower sub-storage module 12, and each of the upper sub-storage module 11 and the lower sub-storage module 12 comprises n rows and b columns of memory cells. Gates of memory cells in the same row are connected to the same word line; memory cells in the same column are connected to each other sequentially in series, and a drain and the source of two adjacent memory cells are respectively connected. One end of each column is connected to a corresponding local bit line through a bit line strobe, and the other end is connected to a source line. Bit line strobes in the same row are connected to the same bit line strobe signal; local bit lines in the same column of the upper sub-storage module 11 and the lower sub-storage module 12 are connected to the same global bit line; and n and b are natural numbers greater than 0.

In this embodiment, global bit lines in different columns are sequentially defined from left to right as GBL1, ..., GBLa, ..., and GBLb; local bit lines in different columns in the upper sub-storage module 11 are sequentially defined from left to right as LBL1-up, ..., LBLa-up, ..., and LBLb-up; and local bit lines in columns in the lower sub-storage module 12 are sequentially defined from left to right as LBL1-down, ..., LBLa-down, ..., and LBLb-down. Bit line strobes in the upper sub-storage module 11 are connected to a first bit line strobe signal SG1, and bit line strobes in the lower sub-storage module 12 are connected to a second bit line strobe signal SG2. Word lines in different rows in the upper sub-storage module 11 are sequentially defined from top to bottom as CG1, ..., and CGn, and word lines in different rows in the lower sub-storage module 12 are sequentially defined from top to bottom as CGn+1, ..., and CG2n. Each column of memory cells in the upper sub-storage module 11 is connected to a first source line SL1, and each column of memory cells in the lower sub-storage module 12 is connected to a second source line SL2.

Figure 4:
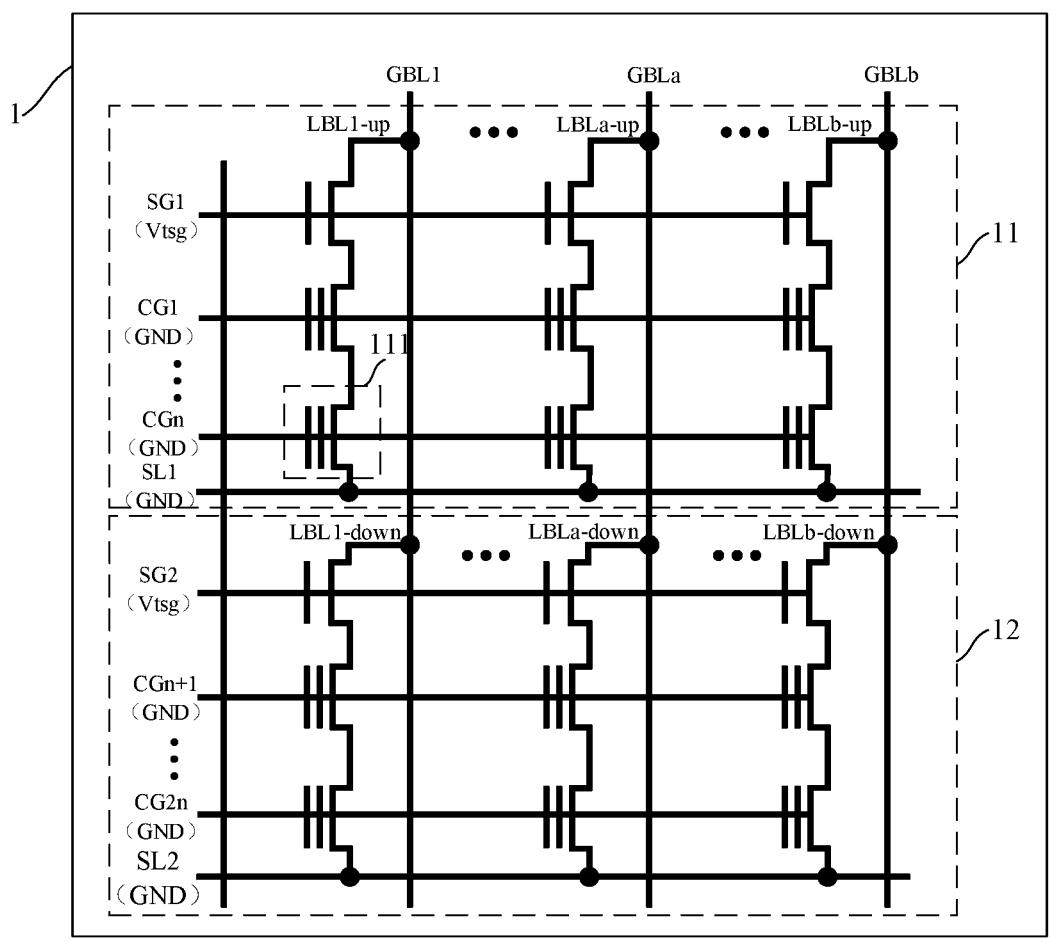
FIG. 4 is a schematic diagram illustrating the principle of eliminating residual charges in a method for programming a 3D NAND flash memory.

Specifically, as shown in FIG. 4, the first bit line strobe signal SG1 in the upper-sub storage modules 11 and the second bit line strobe signal SG2 in the lower sub-storage module 12 are connected to a strobing voltage Vtsg, in order to strobe the bit line strobes (select gates) of the upper sub-storage module 11 and the bit line select gates of the lower sub-storage module 12. Further, the first source line SL1 in the upper sub-storage module 11 and the second source line SL2 in the lower sub-storage module 12 are grounded (GND); and the word lines in the upper sub-storage module 11 and in the lower sub-storage module 12 are grounded (GND), in order to eliminate the residual charges in the storage modules 1. The foregoing operations are performed on each storage modules 1 to eliminate the residual charges in the 3D NAND flash memory array.

Operation S2) Strobe a bit line where an upper sub-storage module 11 is located, to program a to-be-programmed memory cell in the upper sub-storage module 11.

Operation S3) Apply a drain voltage Vbl to the drain of the to-be-programmed memory cell, and float the source of the to-be-programmed memory cell, to generate primary electrons in the to-be-programmed memory cell, where the primary electrons accelerate to collide with a substrate to generate secondary electrons.

Figure 5:
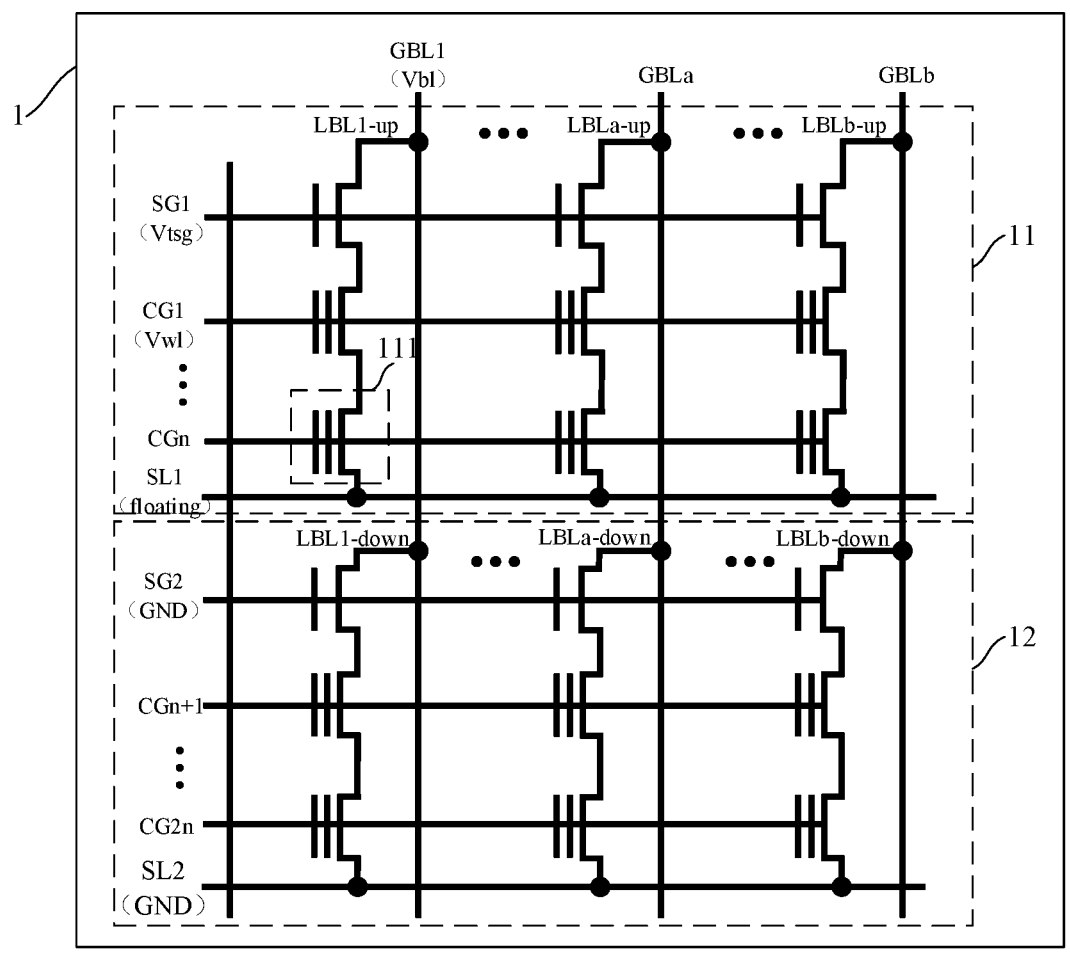
FIG. 5 is a schematic diagram illustrating the principle of applying a drain voltage to an upper sub-storage module and floating a source in a method for programming a 3D NAND flash memory.

Specifically, as shown in FIG. 5, in this embodiment, a memory cell at $n^{th}$ row $1^{st}$ column is defined as the to-be-programmed memory cell 111, a drain voltage Vbl is applied to a first global bit line GBL1 of the upper sub-storage module 11; the first bit line strobe signal SG1 is connected to the strobing voltage Vtsg, to strobe/select a first local bit line LBL1-up in the upper sub-storage module 11 (a bit line strobe of a column, in which the to-be-programmed memory cell 11 is located, is turned on). A first high voltage Vwl is applied to the word lines from the 1st row word line CG1 to the $(n-1)^{th}$ row word line CGn−1 in the upper sub-storage module 11, to strobe memory cells located between the to-be-programmed memory cell 111 and the bit line strobes of the upper sub-storage module 11. The drain voltage Vbl on the first global bit line GBL1 (that is, the first local bit line LBL1-up) is transmitted to the drain of the to-be-programmed memory cell 111, to float the first source line SL1.

In this embodiment, floating refers to that the first source line SL1 is not connected to any signal. As an example, values of the strobing voltage Vtsg and the first high voltage Vwl may be substantially the same. During actual implementation, the values of the strobing voltage Vtsg and the first high voltage Vwl may be set as required provided that a corresponding device can be turned on, which is not limited to this embodiment.

A lateral electric field is generated in the to-be-programmed memory cell 111, to generate electron-hole pairs. Primary electrons are generated and move toward the drain. Next, the primary electrons collide with a side wall of a drain region and accelerate holes downward to collide with a substrate of the to-be-programmed memory cell 111 to generate secondary electrons. As an example, the difference between the voltage applied to the drain and the voltage applied to the substrate of the to-be-programmed memory cell is between 4 V and 8 V (in this embodiment, the substrate is grounded, and the drain voltage Vbl is between 4 V and 8 V), and preferably, the difference may be 4 V, 4.3 V, 4.5 V, 5 V, 6 V, or 7 V, provided that the secondary electrons can be generated, and is not limited to this embodiment.

Specifically, as shown in FIG. 5, the second bit line strobe signal SG2 is grounded (GND), and the second source line SL2 is grounded (GND), to indicate that the lower sub-storage module 12 is unselected.

It should be noted that, in this embodiment, the operation of applying a drain voltage and the operation of floating a source are performed concurrently/simultaneously. In another implementation of the present disclosure, first the source becomes floating, and the drain voltage is then applied, and details thereof are not described herein.

Operation S4) Apply a programming voltage Vpgm to the gate of the to-be-programmed memory cell 111, and keep the drain and the source of the to-be-programmed memory cell 111 at their previous states in operation S3) (that is, the drain of the to-be-programmed memory cell 111 is connected to the drain voltage Vbl, and the source of the to-be-programmed memory cell 111 is floating), The above operation enables the secondary electrons to generate tertiary electrons under the action of a vertical electric field, and injects the tertiary electrons into a floating gate of the to-be-programmed memory cell 111, which in turn completes the programming of the memory cell 111.

Figure 6:
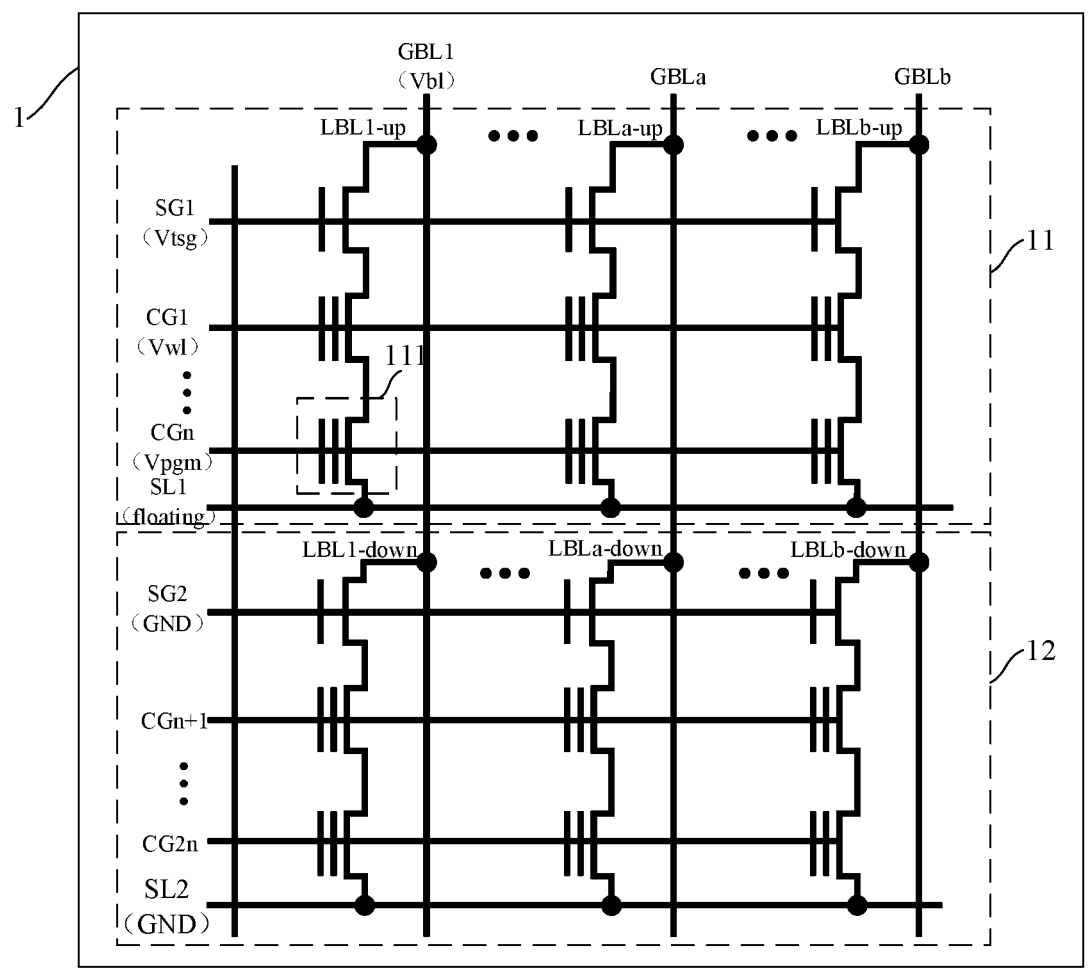
FIG. 6 is a schematic diagram illustrating the principle of applying a programming voltage to an upper sub-storage module in a method for programming a 3D NAND flash memory.

Specifically, as shown in FIG. 6, the voltage of the gate of the to-be-programmed memory cell 111 is increased from 0

V to the programming voltage Vpgm. In this embodiment, the time it takes to increase the voltage of the gate of the memory cell 111 from 0 V to the programming voltage Vpgm may be configured to from 0 μs to 10 μs (e.g., in 1 μs or 2 μs), and this time may be adjusted as required during actual use.

Specifically, in this embodiment, the programming voltage Vpgm is set to be no higher than 10 V. For example, the programming voltage is set to about 5 V, 7 V, 8 V, or 9 V, provided that an electric field can be generated for the secondary electrons to generate the tertiary electrons under the action of the vertical electric field, and the tertiary electrons can be injected into a floating gate of the to-be-programmed memory cell 11, the details thereof are not listed here.

Specifically, in this embodiment, the programming is completed after the programming voltage Vpgm is maintained for a preset time. The preset time may be no longer than (less than) 100 μs (e.g., 5 μs or 10 μs), and the preset time may be adaptively adjusted based on devices of different processes, and details thereof are not listed here.

Operation S5) After completing the programming of the upper sub-storage module, and when the upper sub-storage module maintains a programmed state, strobe the bit line where the lower sub-storage module is located, and repeat operation S3) and operation S4) to achieve programming of the lower sub-storage module.

Figure 7:
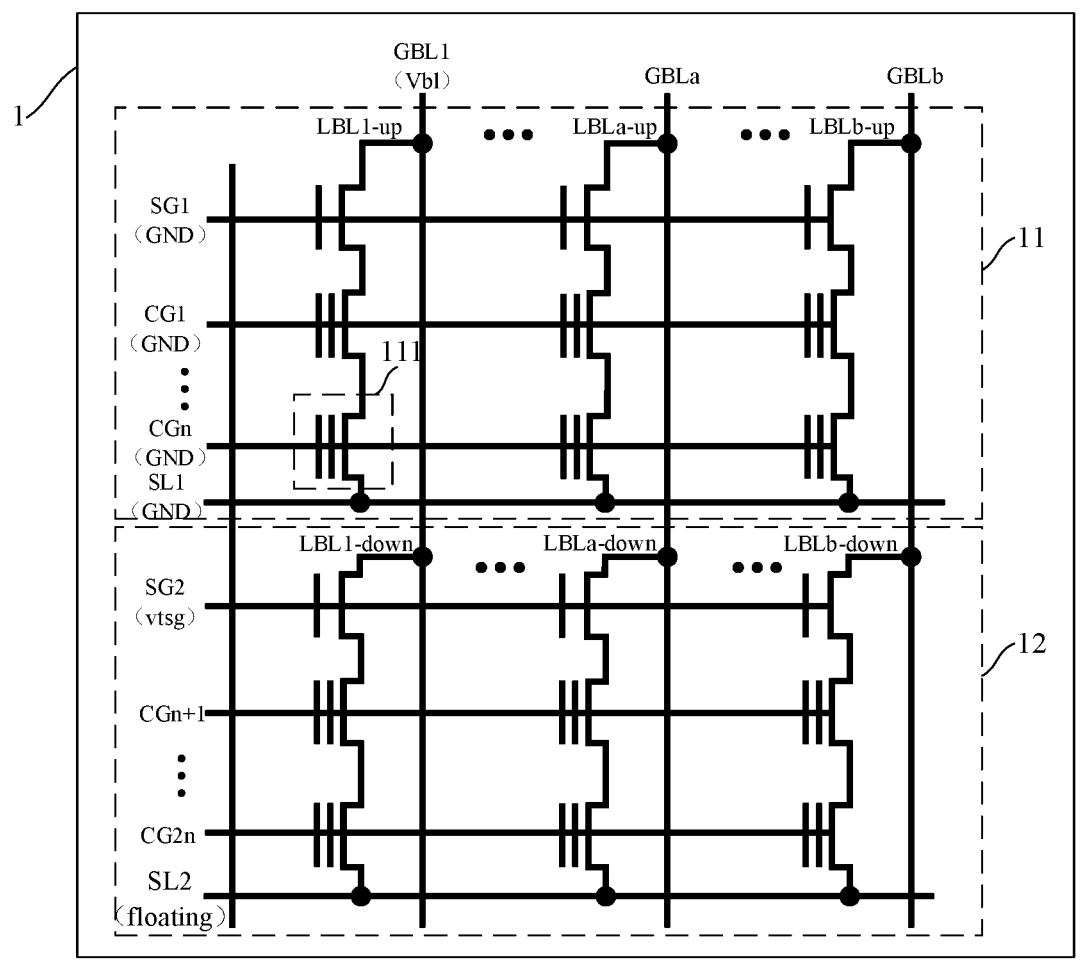
FIG. 7 is a schematic diagram of the principle of applying a drain voltage to a lower sub-storage module and floating a source in a method for programming a 3D NAND flash memory, all according to various embodiments of the present disclosure.

Specifically, as shown in FIG. 7, the first bit line strobe signal SG1 is grounded (GND) and the word lines in the upper sub-storage module 11 are grounded (GND), in order to turn off the bit line strobes and the memory cells of the upper sub-storage module 11. Meanwhile, the first source line SL1 is grounded (GND) to make the upper sub-storage module 11 stay in a programmed state.

Specifically, as shown in FIG. 7, operation S3) is performed to float the source of a to-be-programmed cell in the lower sub-storage module 12 and connect a drain thereof to a drain voltage. Operation S4) is performed to apply a programming voltage to the source of the to-be-programmed cell in the lower sub-storage module 12. For specific operations, reference may be made to the above, and details thereof are not described herein again.

It should be noted that, this embodiment in which the upper sub-storage module may first be programmed and the lower sub-storage module may then be programmed, is used for illustration purposes. During actual use, the lower sub-storage module may first be programmed and the upper sub-storage module may then be programmed, and details thereof are not described herein again.

The programming principle of the method for programming a 3D NAND flash memory according to the present disclosure is as follows:

After initialization, an upper sub-storage module is selected, the source of a to-be-programmed memory cell 111 is floating, and a drain voltage Vbl is applied to a drain. At this time, a lateral electric field is created in the to-be-programmed memory cell 111 to generate electron-hole pairs, and primary electrons are generated and move toward the drain. The primary electrons collide with a side wall of a drain region to accelerate holes downward to collide with a substrate of the to-be-programmed memory cell 111, which may generate secondary electrons. A programming voltage Vpgm is then applied to the gate of the to-be-programmed memory cell 111, for the secondary electrons to generate tertiary electrons under the action of a vertical electric field, and for the tertiary electrons to inject into a floating gate of the to-be-programmed memory cell 111, which in turn completes a programming operation. Afterward, the upper sub-storage module is kept in a programmed state, and a lower sub-storage module is then programmed in the same manner.

In the present disclosure, a lateral electric field and a vertical electric field may be simultaneously formed based on the tertiary electron collision principle, to reduce the programming time from a millisecond level to a microsecond level. The programming method has high efficiency and low power consumption, the gate voltage of a programmed cell can be reduced from about 18 V to under 10 V, and the drain voltage can be set between 0 V and 8 V. In this way, existing problems of high voltage and excessively long time when programming a NAND flash memory array can be effectively resolved, thereby further reducing the size of the charge pump and mutual interference between adjacent memory cells.

In summary, the present disclosure provides a method for programming a 3D NAND flash memory, comprising: S1) providing a 3D flash memory array, and eliminating residual charges in the 3D NAND flash memory array; S2) strobing a bit line where an upper sub-storage module is located, to program a to-be-programmed memory cell in the upper sub-storage module; S3) applying a drain voltage to the drain of the to-be-programmed memory cell, and floating the source of the to-be-programmed memory cell, to generate primary electrons in the to-be-programmed memory cell, where the primary electrons accelerate to collide with a substrate to generate secondary electrons; S4) applying a programming voltage to the gate of the to-be-programmed memory cell, to enable the secondary electrons to generate tertiary electrons under the action of a vertical electric field to inject the tertiary electrons into a floating gate of the to-be-programmed memory cell, to complete programming; and S5) after completing the programming of the upper sub-storage module, And when that the upper sub-storage module remains in a programmed state, strobing a bit line where a lower sub-storage module is located, and repeating operation S3) and operation S4) to achieve programming of the lower sub-storage module. In the method for programming a 3D NAND flash memory according to the present disclosure, programming is completed based on tertiary electron collision. The gate voltage during programming herein is far smaller than the gate voltage of existing Fowler-Nordheim (F-N) tunneling programming methods, and the programming time is short, which can effectively reduce power consumption and avoid interference between adjacent memory cells, thereby improving programming efficiency. Therefore, the present disclosure effectively overcomes various shortcomings in the prior art, and has a high industrial value.

The foregoing embodiments merely exemplify the principles and effects of the present disclosure, and are not intended to limit the scope of the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical ideas disclosed in the present disclosure should still be covered by the claims of the present disclosure.

What is claimed is:

1. A method for programming a 3D NAND flash memory, comprising:
   S1) providing a 3D NAND flash memory array having a plurality of storage modules each of which including an upper sub-storage module and a lower sub-storage module, and eliminating residual charges in the 3D NAND flash memory array;

S2) strobing a bit line where the upper sub-storage module is located, to program a to-be-programmed memory cell in the upper sub-storage module;

S3) applying a drain voltage to the drain of the to-be-programmed memory cell, and floating the source of the to-be-programmed memory cell, to generate primary electrons in the to-be-programmed memory cell, wherein the primary electrons accelerate to collide with a substrate to generate secondary electrons;

S4) applying a programming voltage to the gate of the to-be-programmed memory cell, to enable the secondary electrons to generate tertiary electrons and to inject the tertiary electrons into a floating gate of the to-be-programmed memory cell, to complete programming; and S5) after completing the programming of the upper sub-storage module and maintaining the upper sub-storage module in a programmed state, strobing a bit line where the lower sub-storage module is located, and repeating operation S3) and operation S4) to achieve programming of the lower sub-storage module.

2. The method for programming a 3D NAND flash memory as in claim 1,
wherein both the upper sub-storage module and the lower sub-storage module comprise n rows and b columns of memory cells,
wherein gates of memory cells in the same row are connected to the same word line; memory cells in the same column are connected to each other in series, one end of each column is connected to a corresponding local bit line through a bit line strobe, the other end is connected to a source line, and bit line strobes in the same row are connected to the same bit line strobe signal,
wherein local bit lines in the same column of the upper sub-storage module and the lower sub-storage module are connected to the same global bit line, and
wherein n and b are natural numbers greater than 0.

3. The method for programming a 3D NAND flash memory as in claim 2, wherein the operation S1) further comprises:
strobing bit line strobes of the upper sub-storage module and bit line strobes of the lower sub-storage module, to ground word lines and source lines of the upper sub-storage module and the lower sub-storage module of each storage module, and to eliminate residual charges in the 3D NAND flash memory array.

4. The method for programming a 3D NAND flash memory as in claim 2, wherein the applying the drain voltage at operation S3) comprises:
applying the drain voltage to a global bit line where the to-be-programmed memory cell is located, and
strobing bit line strobes of the upper sub-storage module and memory cells between the to-be-programmed memory cell and the bit line strobes of the upper sub-storage module, in order to transmit the drain voltage to the drain of the to-be-programmed memory cell and float the source line corresponding to the to-be-programmed memory cell.

5. The method for programming a 3D NAND flash memory as in claim 4, wherein the operation S3) further comprises:
turning off bit line strobes of the lower sub-storage module, and
grounding source lines of the lower sub-storage module.

6. The method for programming a 3D NAND flash memory as in claim 2, wherein the maintaining the programmed state of the upper sub-storage module at operation S5) comprises:
turning off bit line strobes of the upper sub-storage module and the memory cells, and grounding the source lines.

7. The method for programming a 3D NAND flash memory as in claim 1, wherein
the programming is completed after the programming voltage at operation S4) is maintained for a preset time.

8. The method for programming a 3D NAND flash memory as in claim 7, wherein
the preset time is less than 100 µs.

9. The method for programming a 3D NAND flash memory as in claim 1, wherein
a difference between the voltage applied to the drain and the voltage applied to the substrate of the to-be-programmed memory cell is between 4 V and 8 V.

10. The method for programming a 3D NAND flash memory as in claim 1, wherein
the programming voltage is not higher than 10 V.

11. The method for programming a 3D NAND flash memory as in claim 1, wherein operation S3) comprises:
first floating the source of the to-be-programmed memory cell, and then applying a drain voltage to the drain of the to-be-programmed memory cell.

12. The method for programming a 3D NAND flash memory as in claim 1, wherein
the programming sequence of the upper sub-storage module and the lower sub-storage module are reversed.

* * * * *